United States Patent
Chang et al.

(10) Patent No.: US 11,081,485 B2
(45) Date of Patent: Aug. 3, 2021

(54) MONOLITHIC INTEGRATED CIRCUIT DEVICE HAVING GATE-SINKING PHEMTS

(71) Applicant: WIN Semiconductors Corp., Tao Yuan (TW)

(72) Inventors: Chia-Ming Chang, Tao Yuan (TW); Jung-Tao Chung, Tao Yuan (TW); Yan-Cheng Lin, Tao Yuan (TW); Lung-Yi Tseng, Tao Yuan (TW)

(73) Assignee: Win Semiconductors Corp., Tao Yuan (TW)

( * ) Notice: Subject to any disclaimer, the term of this patent is extended or adjusted under 35 U.S.C. 154(b) by 0 days.

(21) Appl. No.: 16/661,472

(22) Filed: Oct. 23, 2019

(65) Prior Publication Data

US 2021/0125985 A1 Apr. 29, 2021

(51) Int. Cl.
*H01L 27/095* (2006.01)
*H01L 29/778* (2006.01)
*H01L 29/80* (2006.01)

(52) U.S. Cl.
CPC ........ *H01L 27/095* (2013.01); *H01L 29/7786* (2013.01); *H01L 29/802* (2013.01)

(58) Field of Classification Search
CPC . H01L 27/095; H01L 29/802; H01L 29/7786; H01L 29/66431; H01L 29/122–127; H01L 29/15–158; H01L 29/66462; H01L 29/778–7789; H01L 2924/13064
See application file for complete search history.

(56) References Cited

U.S. PATENT DOCUMENTS

| | | | | |
|---|---|---|---|---|
| 8,610,173 B2* | 12/2013 | Chini | ................... | H01L 21/8252 257/194 |
| 2002/0171076 A1* | 11/2002 | Danzilio | ............. | H01L 27/0605 257/12 |
| 2005/0110054 A1* | 5/2005 | Wohlmuth | .......... | H01L 27/0883 257/267 |
| 2006/0208279 A1* | 9/2006 | Robinson | .......... | H01L 29/66462 257/194 |
| 2012/0326215 A1* | 12/2012 | Srivastava | .......... | H01L 29/0653 257/288 |

(Continued)

*Primary Examiner* — Shahed Ahmed
(74) *Attorney, Agent, or Firm* — Muncy, Geissler, Olds & Lowe, P.C.

(57) ABSTRACT

A monolithic integrated circuit device formed in a multi-layer structure comprises a low-pinch-off-voltage pHEMT and a high-pinch-off-voltage pHEMT. A Schottky layer in the multi-layer structure contains at least three stacked regions of semiconductor material, wherein each of the two adjacent stacked regions differs in material and provides a stacked region contact interface therebetween. The gate-sinking pHEMTs each includes a gate contact, a first gate metal layer, a gate-sinking region, and a gate-sinking bottom boundary. The first gate metal layers are in contact with the topmost stacked region of the Schottky layer. The gate-sinking regions are beneath the first gate metal layers. The gate-sinking bottom boundary of the high-pinch-off-voltage pHEMT, which is closer to the semiconductor substrate than the gate-sinking bottom boundary of the low-pinch-off-voltage pHEMT, locates within 10 Å above or below one of the stacked region contact interfaces of the Schottky layer.

19 Claims, 15 Drawing Sheets

(56) References Cited

U.S. PATENT DOCUMENTS

| | | | |
|---|---|---|---|
| 2013/0062667 A1* | 3/2013 | Chini | H01L 21/8252 |
| | | | 257/195 |
| 2016/0300835 A1* | 10/2016 | Xia | H01L 29/66734 |
| 2016/0351564 A1* | 12/2016 | Azize | H01L 29/66621 |
| 2018/0012986 A1* | 1/2018 | Nevers | H01L 29/7785 |

* cited by examiner

MONOLITHIC INTEGRATED CIRCUIT DEVICE HAVING GATE-SINKING PHEMTS

FIELD OF THE INVENTION

The present invention relates to a monolithic integrated circuit device composed of more than one pseudomorphic high electron mobility transistors (pHEMTs). More specifically, the invention relates to monolithic integrated gate-sinking pHEMTs having inherently extremely uniform pinch-off or threshold voltage across a wafer and from wafer to wafer.

BACKGROUND OF THE INVENTION

Gate-sinking or buried-gate technique has been widely adopted to achieve enhancement-mode (E-mode) pseudomorphic high electron mobility transistors (pHEMTs) in which the pinch-off or threshold voltages (pinch-off voltage hereafter) exhibit positive values due to the reduction of the gate-to-channel distance. As the transistor epitaxial structure and fabrication process are properly designed, the application of the gate-sinking technique should include, but not be limited to E-mode pHEMTs. The gate-sinking technique requires careful control of the temperature and duration during the thermal treatment to ensure that the first deposited gate metal diffuses uniformly, consistently, and fully into the Schottky barrier layer. Accordingly, gate-sinking pHEMTs with highly uniform pinch-off voltage across a wafer and from wafer to wafer are mostly demanded in this field.

In certain applications, such as digital and bias circuits, a plurality of pHEMTs with various pinch-off voltages are desirable. For example, a normally-off (positive pinch-off voltage) pHEMT and a normally-on (negative pinch-off voltage) pHEMT are monolithically integrated on the same semiconductor substrate. FIG. 1 discloses a conventional monolithic integrated circuit device composed of a depletion-mode (D-mode) pHEMT D1 and an E-mode pHEMT E1. The conventional monolithic integrated circuit device comprises a compound semiconductor substrate 100 and an epitaxial structure 110. The epitaxial structure 110 grown on the compound semiconductor substrate 100 sequentially comprises from bottom to top a buffer layer 111, a channel layer 112, a Schottky layer 113, a Schottky contact layer 114, a first etch stop layer 115, a first conductive layer 116, a second etch stop layer 117, a second conductive layer 118. A source electrode 101/103 and a drain electrode 102/104 of the D-mode/E-mode pHEMT are formed on the second conductive layer 118. A gate recess 108 locates between the source electrode 101 and the drain electrode 102 of the D-mode pHEMT with a recess bottom defined by the Schottky contact layer 114. A gate recess 109 locates between the source electrode 103 and the drain electrode 104 of the E-mode pHEMT with a recess bottom defined by the Schottky layer 113. A gate electrode 120 of the D-mode pHEMT is deposited on the Schottky contact layer 114 within the gate recess 108. A gate electrode 130 of the E-mode pHEMT is deposited on the Schottky layer 113 within the gate recess 109. As shown in FIG. 1, the gate electrodes of the D-mode and E-mode pHEMTs are formed on distinct different semiconductor layers. It indicates that extra photolithography and etch steps are required for both of the D-mode and E-mode pHEMTs in the conventional monolithic integrated circuit device.

FIG. 2 discloses another conventional monolithic integrated circuit device composed of a D-mode pHEMT D1 and an E-mode pHEMT E1. As shown in FIG. 2, both of the D-mode and the E-mode pHEMTs are fabricated using the gate-sinking technique. The monolithic integrated circuit device comprises a compound semiconductor substrate 200 and an epitaxial structure 210. The epitaxial structure 210 grown on the compound semiconductor substrate 200 sequentially comprises from bottom to top a buffer layer 211, a channel layer 212, a first Schottky barrier layer 213, a first etch stop layer 214, a second Schottky barrier layer 215, a second etch stop layer 216, and an ohmic contact layer 217. A source electrode 201/203 and a drain electrode 202/204 of the D-mode/E-mode pHEMT are formed on the ohmic contact layer 217. A gate recess 208 locates between the source electrode 201 and the drain electrode 202 of the D-mode pHEMT with a recess bottom defined by the second Schottky barrier layer 215. A gate recess 209 locates between the source electrode 203 and the drain electrode 204 of the E-mode pHEMT with a recess bottom defined by the first Schottky barrier layer 213. The gate electrode 220 of the D-mode pHEMT is deposited on the second Schottky barrier layer 215 within the gate recess 208. The gate electrode 230 of the E-mode pHEMT is deposited on the first Schottky barrier layer 213 within the gate recess 209. A gate-sinking region 221/231 is beneath the gate electrode 220/230 of the D-mode/E-mode pHEMT. In the conventional monolithic integrated circuit device shown in FIG. 2, the respective gate electrodes of the D-mode pHEMT and the E-mode pHEMT are formed on distinct different Schottky layers. It indicates that extra photolithography and etch steps are required to form the D-mode and E-mode gate recesses 208, 209, leading to additional cost and complexity in the pHEMT fabrication process. Most importantly, the etched surfaces of the Schottky barrier layers 213, 215 may cause defects and surface states, which would degrade the transistor performance and alter the pHEMT pinch-off voltage from the target value.

Additionally, the conventional monolithic integrated circuit device shown in FIG. 2 exhibits serious problem in controlling the respective pinch-off voltages of the D-mode pHEMT as well as the E-mode pHEMT. It is practically impossible to rule the bottom boundary of the gate-sinking region 221/231 of the D-mode/E-mode pHEMT perfectly at a specific narrow region within the Schottky barrier layer. This fact can be ascribed to the variations in the thickness of the gate electrodes, thermal treatment temperature, and thermal treatment duration across a wafer and from wafer to wafer. These undesirable effects cause a high degree of variability in transistor pinch-off voltage.

Accordingly, a new design to achieve monolithic integrated gate-sinking pHEMTs having inherently extremely uniform pinch-off voltages across a wafer and from wafer to wafer is very much desirable.

SUMMARY OF THE INVENTION

In order to achieve the expected pinch-off voltage uniformity in a monolithic integrated circuit device having more than one gate-sinking pHEMTs, a composite Schottky layer structure made of stacked semiconductor layers is implemented. By controlling the sinking depth of the gate metal to a specific interface in the stacked semiconductor layers of the Schottky layer, the pinch-off voltage variation of the pHEMT across a wafer and from wafer to wafer can be significantly reduced. Moreover, the pinch-off voltage of each pHEMT in the monolithic integrated circuit device can be tuned to any (positive or negative) desired value. Accordingly, the present invention provides a monolithic integrated circuit device which is composed of a low-pinch-off-voltage pHEMT and a high-pinch-off-voltage pHEMT in a multi-layer structure, wherein the multi-layer structure includes a semiconductor substrate overlaid with a plurality of epitaxial semiconductor layers common to the low-pinch-off-voltage and the high-pinch-off-voltage pHEMTs, including a buffer layer overlaid by a channel layer overlaid by a Schottky layer overlaid by a first cap layer. The Schottky layer comprises from bottom to top at least three stacked regions of semiconductor material, wherein each of the two adjacent stacked regions differs in material and provides a stacked region contact interface therebetween, and any two stacked region contact interfaces differ in distance from the semiconductor substrate. Source and drain contacts of the low-pinch-off-voltage and the high-pinch-off-voltage pHEMTs are coupled to the first cap layer. The low-pinch-off-voltage and the high-pinch-off-voltage pHEMTs each include a gate contact, a first gate metal layer, a gate-sinking region, and a gate-sinking bottom boundary. The respective gate contacts of the low-pinch-off-voltage pHEMT and the high-pinch-off-voltage pHEMT are coupled to the Schottky layer, wherein the respective first gate metal layers of the low-pinch-off-voltage pHEMT and the high-pinch-off-voltage pHEMT are in contact with the topmost stacked region of the Schottky layer. The low-pinch-off-voltage pHEMT gate-sinking region and the high-pinch-off-voltage pHEMT gate-sinking region are beneath the first gate metal layers of the low-pinch-off-voltage pHEMT and the high-pinch-off-voltage pHEMT, respectively. The respective gate-sinking bottom boundaries of the low-pinch-off-voltage pHEMT and the high-pinch-off-voltage pHEMT are located within the Schottky layer, wherein the gate-sinking bottom boundary of the high-pinch-off-voltage pHEMT is closer to the semiconductor substrate than the gate-sinking bottom boundary of the low-pinch-off-voltage pHEMT, and the gate-sinking bottom boundary of the high-pinch-off-voltage pHEMT is located within 10 Å above or below one of the stacked region contact interfaces of the Schottky layer.

Moreover, the present invention provides a monolithic integrated circuit device comprising a low-pinch-off-voltage pHEMT and a high-pinch-off-voltage pHEMT in a multi-layer structure, wherein the multi-layer structure includes a semiconductor substrate overlaid with a plurality of epitaxial semiconductor layers common to the low-pinch-off-voltage and the high-pinch-off-voltage pHEMTs, including a buffer layer overlaid by a channel layer overlaid by a Schottky layer overlaid by a first contact layer overlaid by a first cap layer. The Schottky layer comprises from bottom to top at least three stacked regions of semiconductor material, wherein each of the two adjacent stacked regions differs in material and provides a stacked region contact interface therebetween, and any two stacked region contact interfaces differ in distance from the semiconductor substrate. The first contact layer is in contact with an upper surface of the topmost stacked region of the Schottky layer, and an uppermost contact interface is provided between the first contact layer and the topmost stacked region of the Schottky layer. Source and drain contacts of the low-pinch-off-voltage and the high-pinch-off-voltage pHEMTs are coupled to the first cap layer. The low-pinch-off-voltage and the high-pinch-off-voltage pHEMTs each include a gate contact, a first gate metal layer, a gate-sinking region, and a gate-sinking bottom boundary. The respective gate contacts of the low-pinch-off-voltage pHEMT and the high-pinch-off-voltage pHEMT are coupled to the Schottky layer, wherein the respective first gate metal layers of the low-pinch-off-voltage pHEMT and the high-pinch-off-voltage pHEMT are in contact with the first contact layer. The low-pinch-off-voltage pHEMT gate-sinking region and the high-pinch-off-voltage pHEMT gate-sinking region are beneath the first gate metal layers of the low-pinch-off-voltage pHEMT and the high-pinch-off-voltage pHEMT, respectively. The gate-sinking bottom boundary of the low-pinch-off-voltage pHEMT is located within the Schottky layer or within 10 Å above or below the uppermost contact interface. The gate-sinking bottom boundary of the high-pinch-off-voltage pHEMT is located within the Schottky layer and within 10 Å above or below one of the stacked region contact interfaces of the Schottky layer. And the gate-sinking bottom boundary of the high-pinch-off-voltage pHEMT is closer to the semiconductor substrate than the gate-sinking bottom boundary of the low-pinch-off-voltage pHEMT.

In some embodiments, the gate-sinking bottom boundary of the low-pinch-off-voltage pHEMT is located within 10 Å above or below one of the stacked region contact interfaces of the Schottky layer.

In some embodiments, the gate-sinking bottom boundary of the high-pinch-off-voltage pHEMT is located at one of the stacked region contact interfaces of the Schottky layer.

In some embodiments, the gate-sinking bottom boundary of the low-pinch-off-voltage pHEMT is located at one of the stacked region contact interfaces of the Schottky layer or at the uppermost contact interface.

In some embodiments, the first contact layer includes at least one of GaAs, AlGaAs, AlGaAsP, InAlGaAs, InGaP, InGaPAs, and AlInGaP, and the first contact layer differs in material from the topmost stacked region of the Schottky layer.

In some embodiments, in any two adjacent stacked regions of the Schottky layer, one stacked region composed of AlGaAs-based semiconductor material alternates with the other stacked region composed of InGaP-based semiconductor material, wherein the AlGaAs-based semiconductor material includes at least one of AlGaAs, AlGaAsP, and InAlGaAs, and wherein the InGaP-based semiconductor material includes at least one of InGaP, InGaPAs, and AlInGaP.

In some embodiments, the respective first gate metal layers of the low-pinch-off-voltage pHEMT and the high-pinch-off-voltage pHEMT include at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), and rhenium (Re).

In some embodiments, the respective first gate metal layers of the low-pinch-off-voltage pHEMT and the high-pinch-off-voltage pHEMT are made of different materials.

In some embodiments, the respective first gate metal layers of the low-pinch-off-voltage pHEMT and the high-pinch-off-voltage pHEMT are made of the same material.

In some embodiments, the first gate metal layer of the high-pinch-off-voltage pHEMT is greater in thickness than the first gate metal layer of the low-pinch-off-voltage pHEMT.

In some embodiments, the plurality of epitaxial semiconductor layers further comprise an etch stop layer and a second cap layer, wherein the etch stop layer is formed on the first cap layer, the second cap layer is formed on the etch stop layer, and the respective source and drain contacts of the low-pinch-off-voltage pHEMT and the high-pinch-off-voltage pHEMT are coupled to the second cap layer.

In some embodiments, the etch stop layer includes at least one of InGaP, InGaPAs, AlInGaP, and AlAs, wherein the second cap layer is GaAs.

In some embodiments, the first cap layer is GaAs, wherein the channel layer includes at least one of GaAs and InGaAs, the buffer layer includes at least one of GaAs and AlGaAs, and the compound semiconductor substrate is GaAs.

For further understanding the characteristics and effects of the present invention, some preferred embodiments referred to drawings are in detail described as follows.

DETAILED DESCRIPTIONS OF PREFERRED EMBODIMENTS

Figure 1:
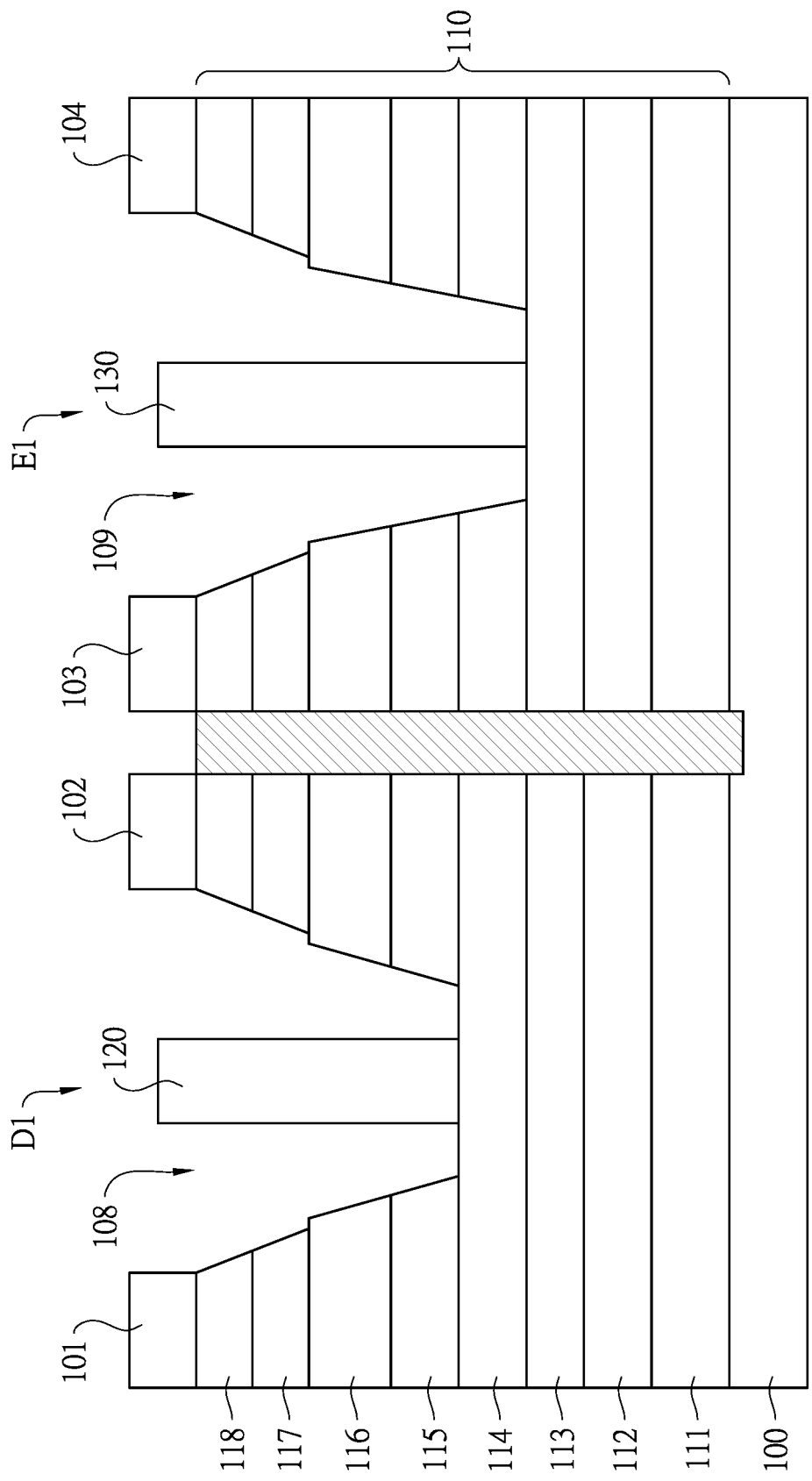
FIG. 1 is a cross-sectional side view of a conventional embodiment of a monolithic integrated circuit device.
Figure 2:
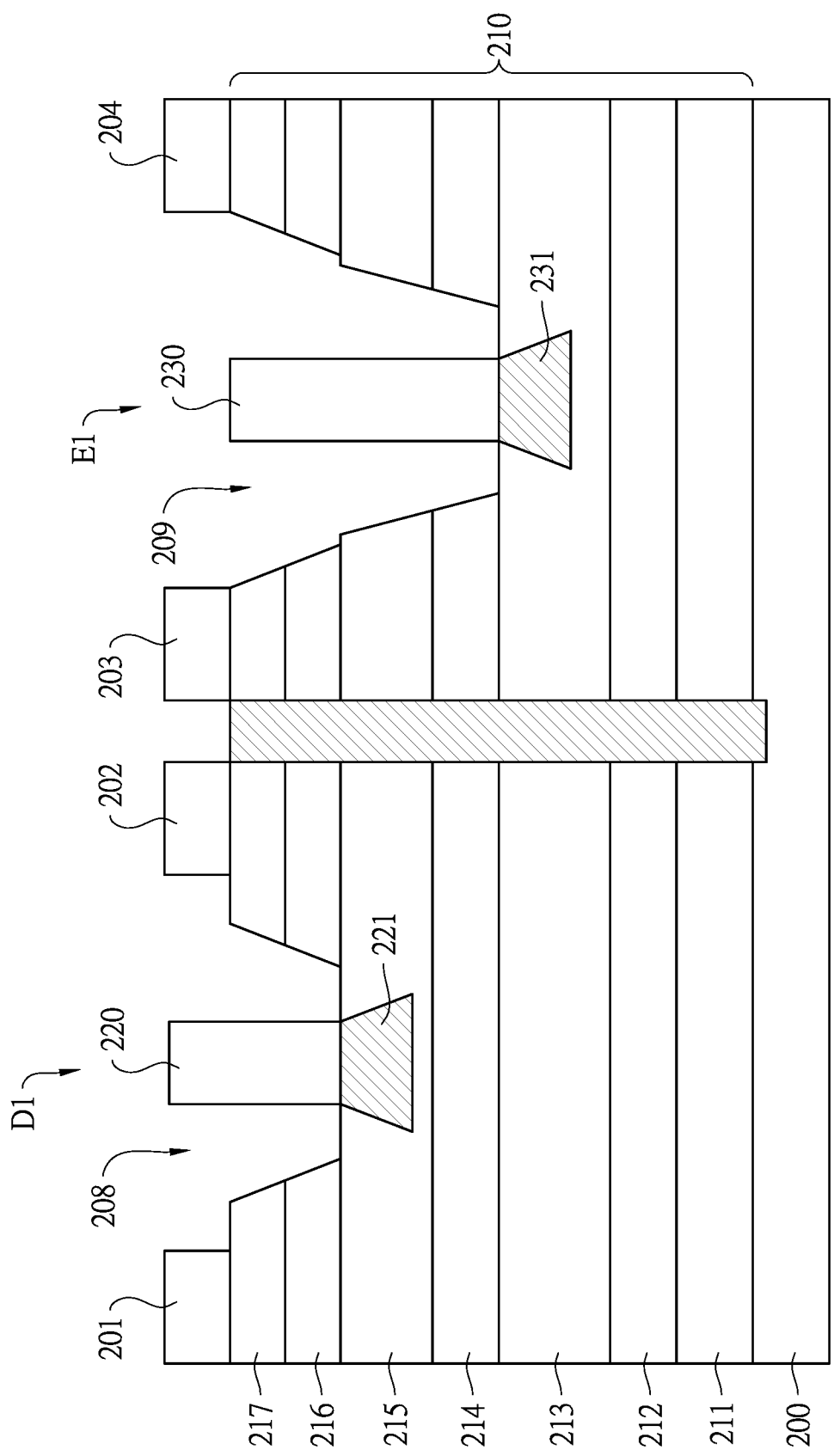
FIG. 2 is another cross-sectional side view of a conventional embodiment of a monolithic integrated circuit device having gate-sinking pHEMTs.
Figure 3A:
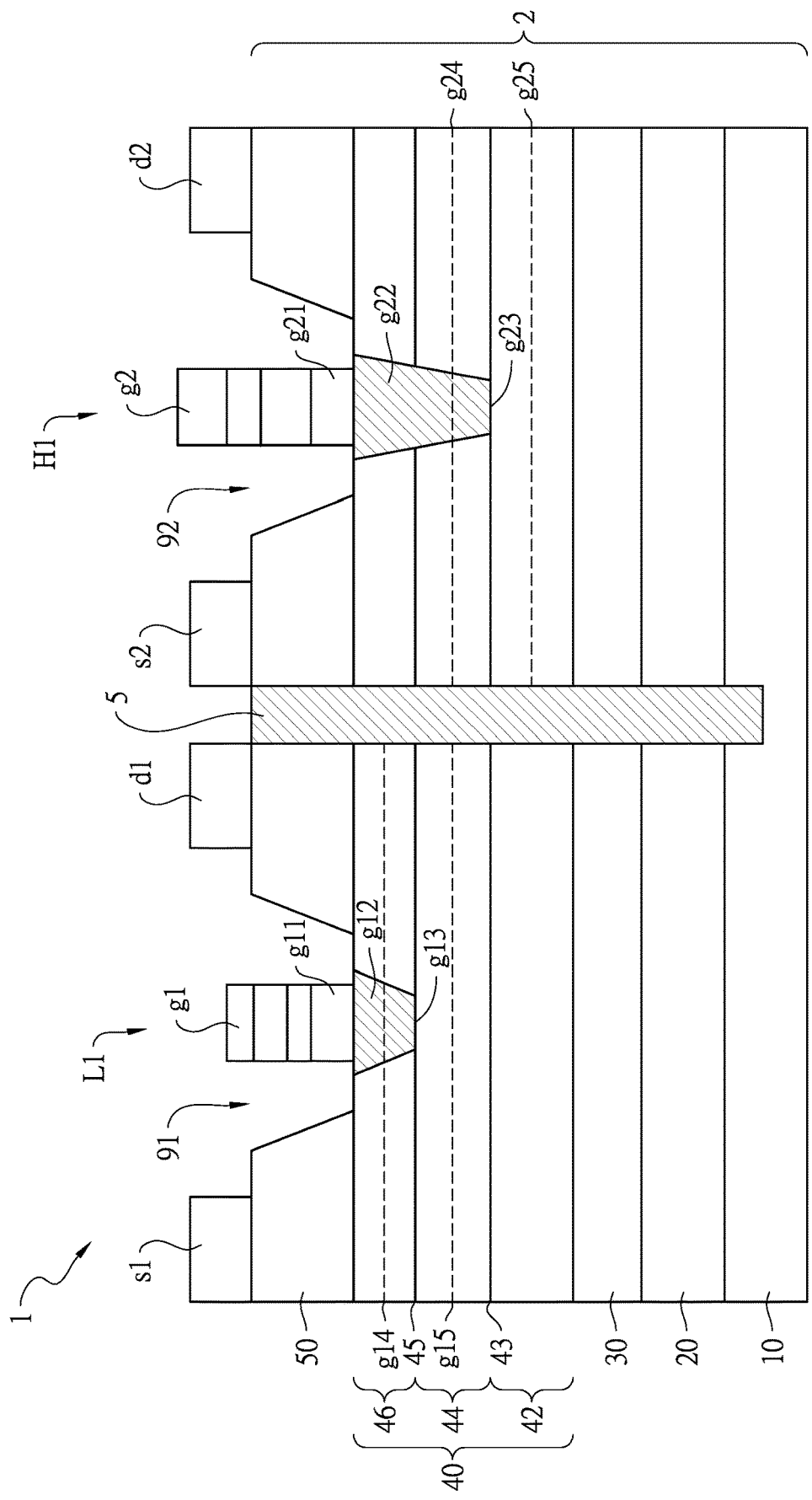
FIGS. 3A-3G are cross-sectional side views of embodiments of a monolithic integrated circuit device having gate-sinking pHEMTs according to the present invention.

FIG. 3A is a cross-sectional side view of an embodiment of a monolithic integrated circuit device having gate-sinking pHEMTs. The monolithic integrated circuit device having gate-sinking pHEMTs 1 comprises a low-pinch-off-voltage pHEMT L1 and a high-pinch-off-voltage pHEMT H1 in a multi-layer structure 2. The multi-layer structure 2 includes a semiconductor substrate 10 overlaid with a plurality of epitaxial semiconductor layers common to the low-pinch-off-voltage and the high-pinch-off-voltage pHEMTs. The plurality of epitaxial semiconductor layers include a buffer layer 20 overlaid by a channel layer 30 overlaid by a Schottky layer 40 overlaid by a first cap layer 50. The Schottky layer 40 comprises three stacked regions 42, 44, and 46 of semiconductor material from bottom to top, in which each of the two adjacent stacked regions differs in material. A stacked region contact interface 43 is provided between the adjacent stacked regions 42 and 44. A stacked region contact interface 45 is provided between the adjacent stacked regions 44 and 46. The stacked region contact interfaces 43 and 45 differ in distance from the semiconductor substrate. The plurality of epitaxial semiconductor layers 2 comprises an isolation region 5 locating between the low-pinch-off-voltage pHEMT L1 and the high-pinch-off-voltage pHEMT H1. Each of the pHEMTs L1, H1 is electrically isolated by the isolation region 5. The source and drain contacts s1 and d1 of the low-pinch-off-voltage pHEMT L1 are coupled to the first cap layer 50. The source and drain contacts s2, d2 of the high-pinch-off-voltage pHEMT H1 are coupled to the first cap layer 50. The low-pinch-off-voltage pHEMT L1 contains a gate contact g1. The gate contact g1 comprises a first gate metal layer g11. The gate contact g1 may further comprise a second gate metal layer deposited on the first gate metal layer g11. A gate-sinking region g12 is beneath the first gate metal layer g11. The gate-sinking region g12 has a gate-sinking bottom boundary g13. The high-pinch-off-voltage pHEMT H1 contains a gate contact g2. The gate contact g2 comprises a first gate metal layer g21. The gate contact g2 may further comprise a second gate metal layer deposited on the first gate metal layer g21. A gate-sinking region g22 is beneath the first gate metal layer g21. The gate-sinking region g22 has a gate-sinking bottom boundary g23. A gate recess 91 of the low-pinch-off-voltage pHEMT L1 locates between the source contact s1 and the drain contact d1. A gate recess 92 of the high-pinch-off-voltage pHEMT H1 locates between the source contact s2 and the drain contact s2. The gate contact g1 of the low-pinch-off-voltage pHEMT L1 locates within the gate recess 91. The gate contact g1 is coupled to the Schottky layer 40. The gate contact g2 of the high-pinch-off-voltage pHEMT H1 locates within the gate recess 92. The gate contact g2 is coupled to the Schottky layer 40. The respective first gate metal layers g11 and g21 of the low-pinch-off-voltage pHEMT L1 and the high-pinch-off-voltage pHEMT H1 are in contact with the topmost stacked region 46 of the Schottky layer 40. The low-pinch-off-voltage pHEMT gate-sinking region g12 is beneath the low-pinch-off-voltage pHEMT first gate metal layer g11. The high-pinch-off-voltage pHEMT gate-sinking region g22 is beneath the high-pinch-off-voltage pHEMT first gate metal layer g21.

Figure 3B:
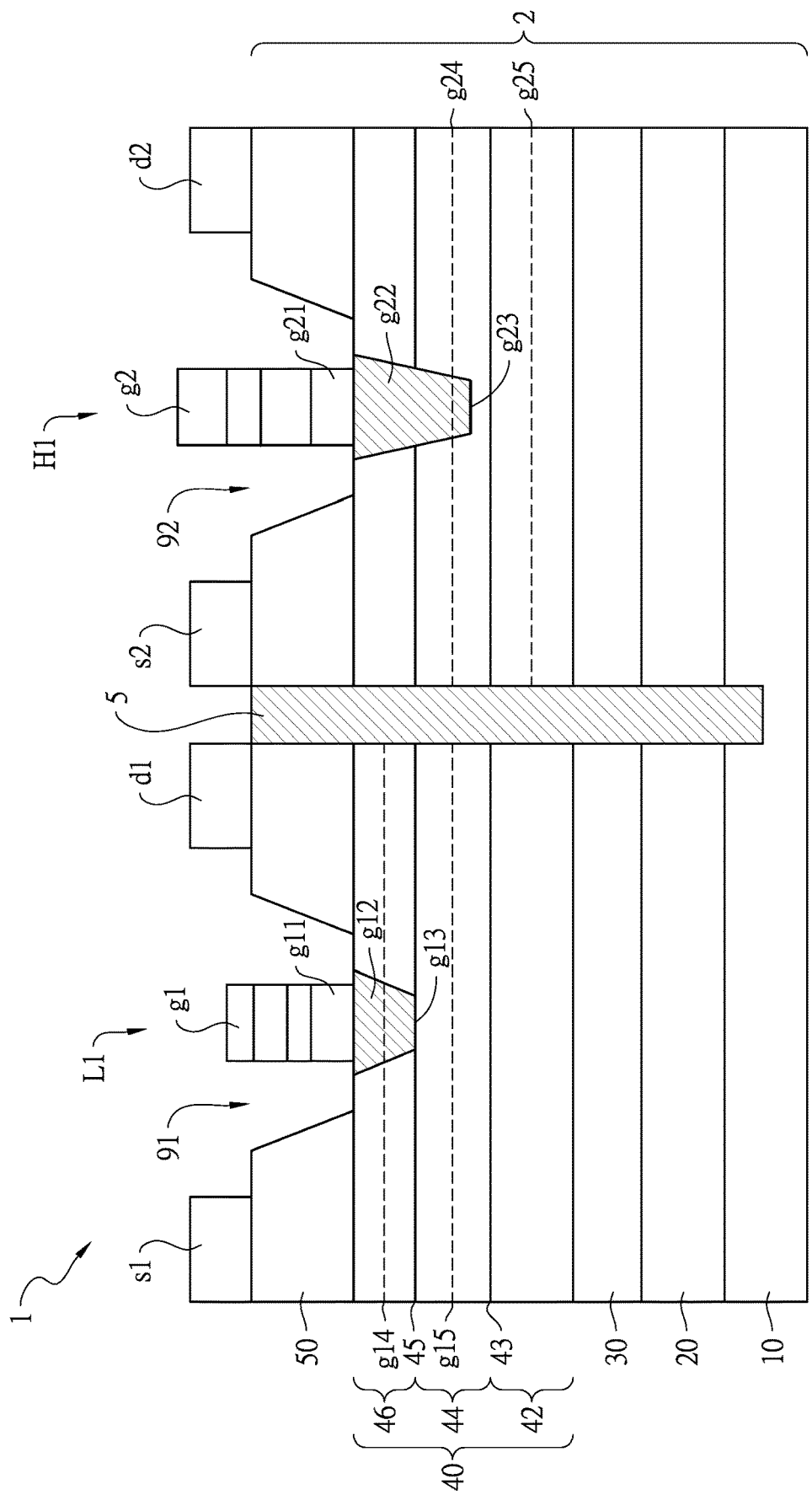
Figure 3C:
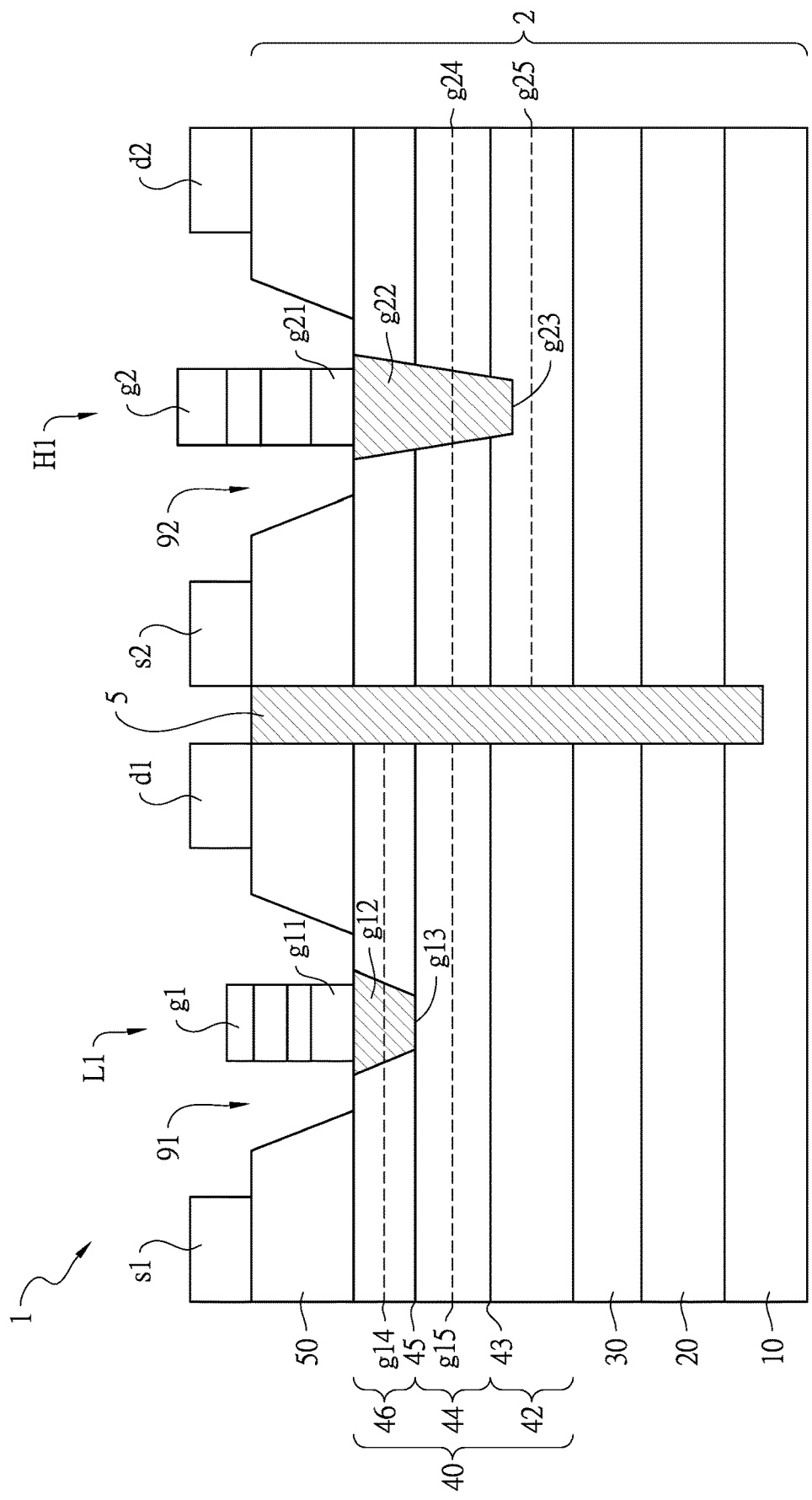
Figure 3D:
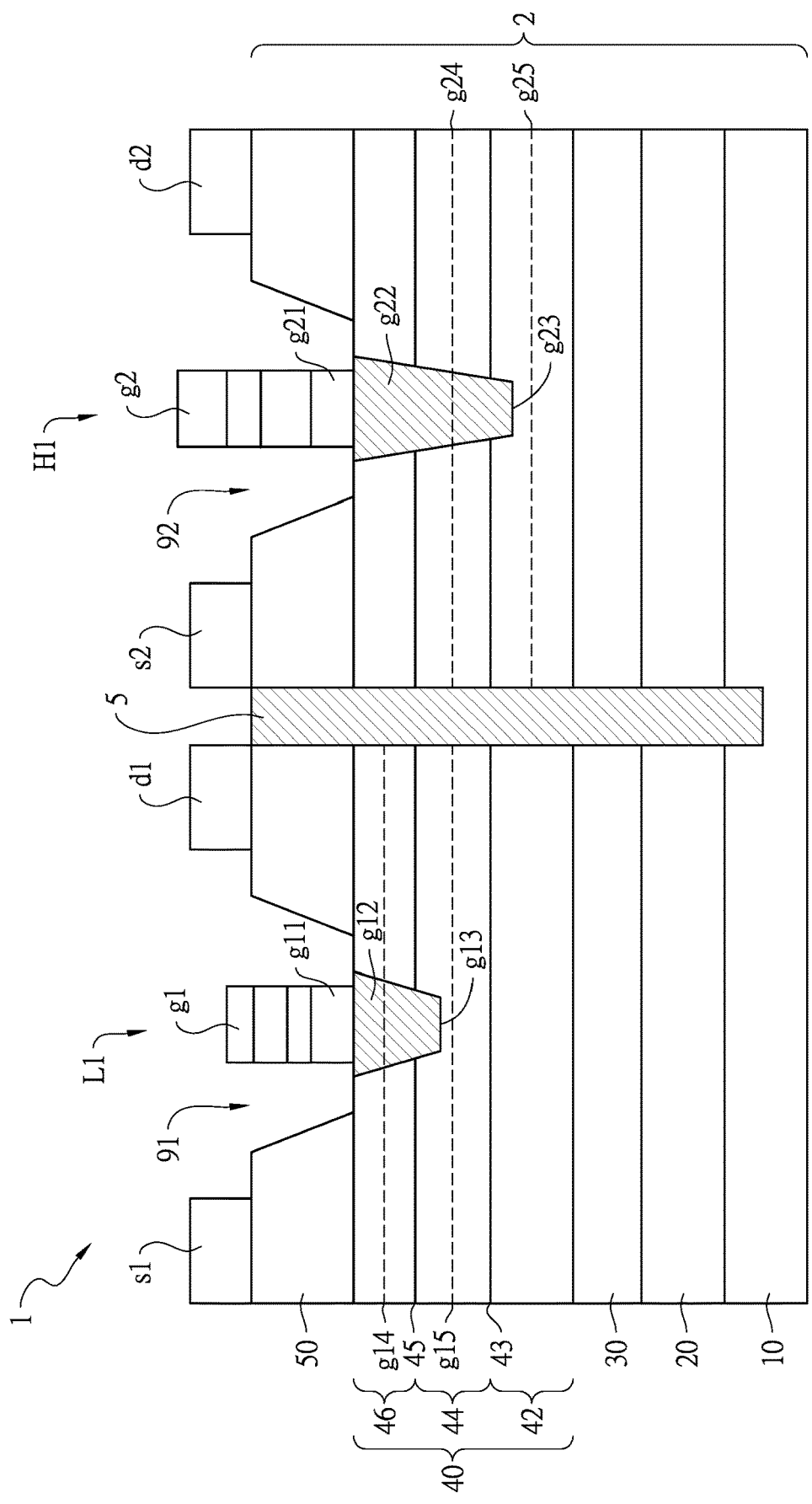
Figure 3E:
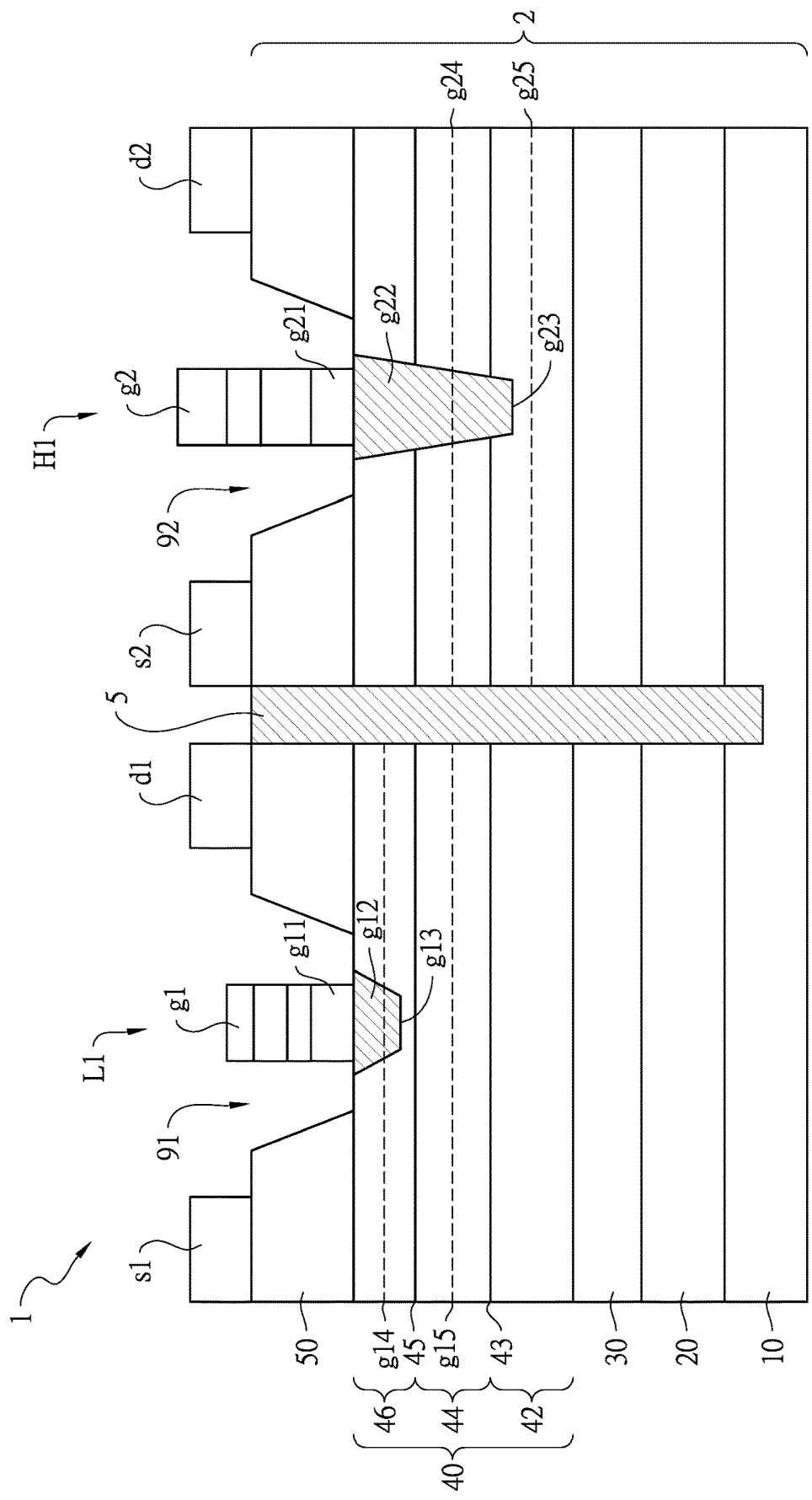

The gate-sinking bottom boundaries g13 and g23 are located within the Schottky layer 40. The gate-sinking bottom boundary g23 of the high-pinch-off-voltage pHEMT H1 is closer to the semiconductor substrate 10 than the gate-sinking bottom boundary g13 of the low-pinch-off-voltage pHEMT L1. The gate-sinking bottom boundary g23 of the high-pinch-off-voltage pHEMT H1 is located between an upper limit g24 and a lower limit g25. The upper limit g24 is 10 Å above one of the stacked region contact interfaces of the Schottky layer 40. The lower limit g25 is 10 Å below the same stacked region contact interface. In some embodiments, the gate-sinking bottom boundary g23 of the high-pinch-off-voltage pHEMT H1 may be located at one of the stacked region contact interfaces of the Schottky layer 40. In some embodiments, the gate-sinking bottom boundary g13 of the low-pinch-off-voltage pHEMT L1 is located between an upper limit g14 and a lower limit g15. The upper limit g24 is 10 Å above one of the stacked region contact interfaces of the Schottky layer 40. The lower limit g15 is 10 Å below the same stacked region contact interface. In some embodiments, the gate-sinking bottom boundary g13 of the low-pinch-off-voltage pHEMT L1 is located at one of the stacked region contact interfaces of the Schottky layer 40. In the embodiment shown in FIG. 3A, the gate-sinking bottom boundary g13 of the low-pinch-off-voltage pHEMT L1 is located at the stacked region contact interface 45 of the Schottky layer 40, and the gate-sinking bottom boundary g23 of the high-pinch-off-voltage pHEMT H1 is located at the stacked region contact interface 43 of the Schottky layer 40. FIGS. 3B-3E show other embodiments of the monolithic integrated circuit device having gate-sinking pHEMTs of the present invention. In FIGS. 3B-3E, the upper limit g14 and the lower limit g15 are 10 Å above and 10 Å below the stacked region contact interface 45, respectively. The upper limit g24 and the lower limit g25 are 10 Å above and 10 Å below the stacked region contact interface 43, respectively. In FIG. 3B, the gate-sinking bottom boundary g13 of the low-pinch-off-voltage pHEMT L1 is located at the stacked region contact interface 45 of the Schottky layer 40, and the gate-sinking bottom boundary g23 of the high-pinch-off-voltage pHEMT H1 is located between the upper limit g24 and the stacked region contact interface 43 of the Schottky layer 40. In FIG. 3C, the gate-sinking bottom boundary g13 of the low-pinch-off-voltage pHEMT L1 is located at the stacked region contact interface 45 of the Schottky layer 40, and the gate-sinking bottom boundary g23 of the highpinch-off-voltage pHEMT H1 is located between the lower limit g25 and the stacked region contact interface 43 of the Schottky layer 40. In FIG. 3D, the gate-sinking bottom boundary g13 of the low-pinch-off-voltage pHEMT L1 is located between the lower limit g15 and the stacked region contact interface 45 of the Schottky layer 40, and the gate-sinking bottom boundary g23 of the high-pinch-off-voltage pHEMT H1 is located between the lower limit g25 and the stacked region contact interface 43 of the Schottky layer 40. In FIG. 3E, the gate-sinking bottom boundary g13 of the low-pinch-off-voltage pHEMT L1 is located between the upper limit g14 and the stacked region contact interface 45 of the Schottky layer 40, and the gate-sinking bottom boundary g23 of the high-pinch-off-voltage pHEMT H1 is located between the lower limit g25 and the stacked region contact interface 43 of the Schottky layer 40.

In some embodiments, in any two adjacent stacked regions of the Schottky layer 40, one stacked region composed of AlGaAs-based semiconductor material alternates with the other stacked region composed of InGaP-based semiconductor material, wherein the AlGaAs-based semiconductor material includes at least one of AlGaAs, AlGaAsP, and InAlGaAs, and wherein the InGaP-based semiconductor material includes at least one of InGaP, InGaPAs, and AlInGaP.

Figure 3F:
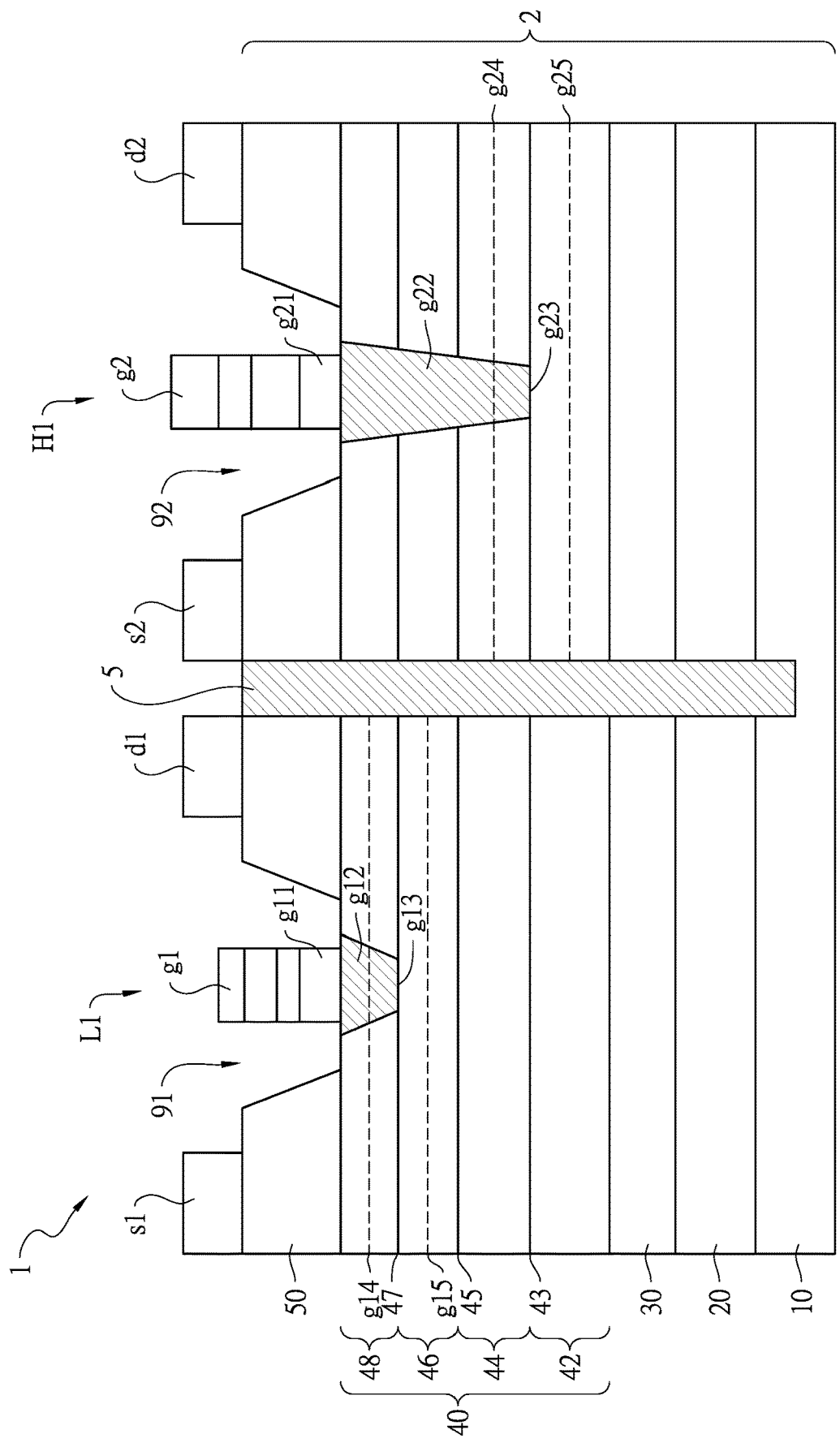
Figure 3G:
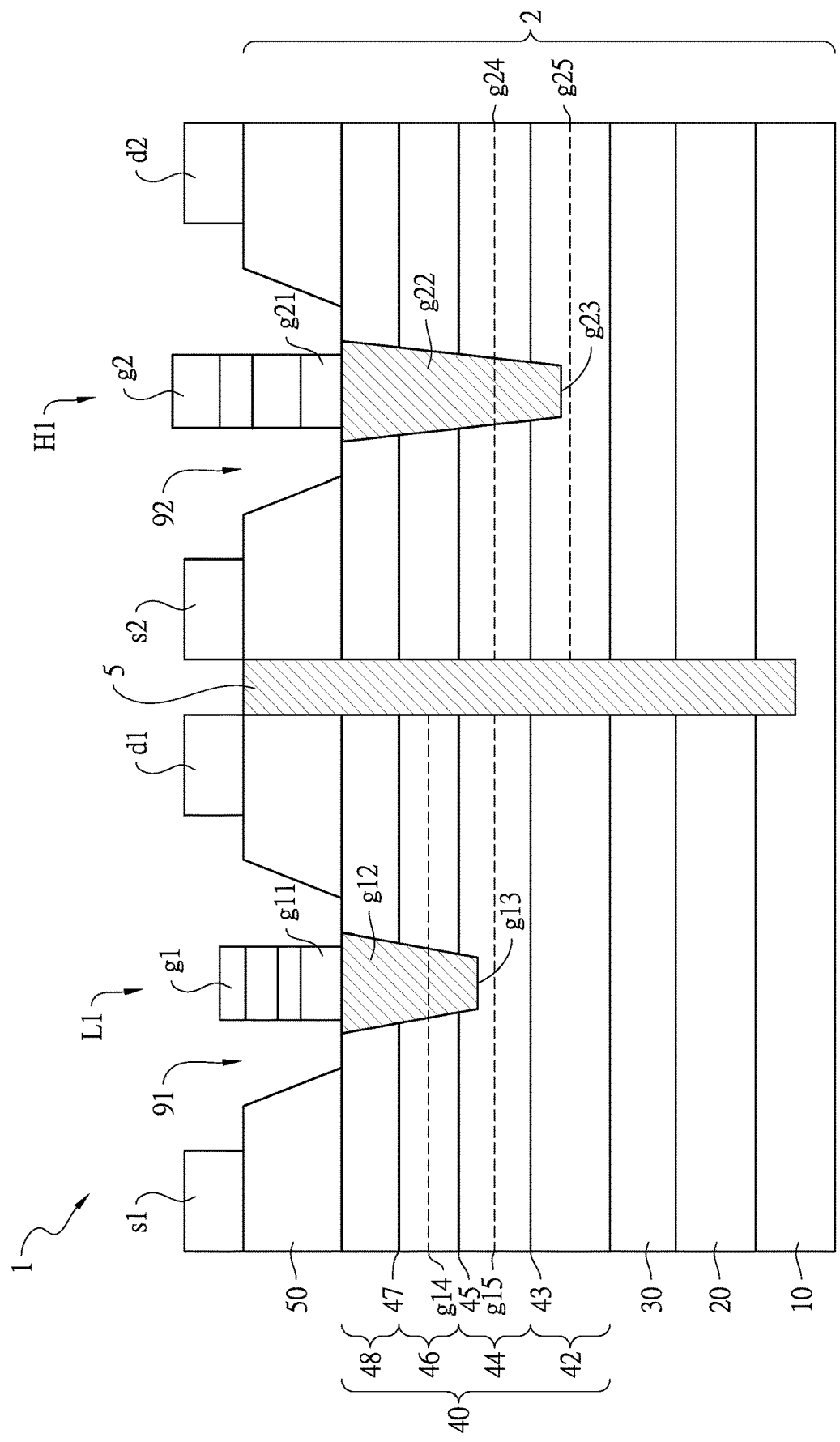

In the present invention, the Schottky layer may comprise more than three stacked regions of semiconductor material, in which each of the two adjacent stacked regions differs in material and provides a stacked region contact interface therebetween, and any two stacked region contact interfaces differ in distance from the semiconductor substrate. FIGS. 3F and 3G show other embodiments of the monolithic integrated circuit device having gate-sinking pHEMTs of the present invention, in which the Schottky layer 40 comprises from bottom to top four stacked regions 42, 44, 46, and 48 of semiconductor material. Stacked region contact interfaces 43, 45, and 47 are provided between the stacked regions. As shown in FIG. 3F, the gate-sinking bottom boundary g13 of the low-pinch-off-voltage pHEMT L1 is located at the stacked region contact interface 47 of the Schottky layer 40, and the gate-sinking bottom boundary g23 of the high-pinch-off-voltage pHEMT H1 is located at the stacked region contact interface 43 of the Schottky layer 40. In FIG. 3G, the upper limit g14 and the lower limit g15 are 10 Å above and 10 Å below the stacked region contact interface 45, respectively. The upper limit g24 and the lower limit g25 are 10 Å above and 10 Å below the stacked region contact interface 43, respectively. The gate-sinking bottom boundary g13 of the low-pinch-off-voltage pHEMT L1 is located between the lower limit g15 and the stacked region contact interface 45 of the Schottky layer 40. The gate-sinking bottom boundary g23 of the high-pinch-off-voltage pHEMT H1 is located between the lower limit g25 and the stacked region contact interface 43 of the Schottky layer 40.

Figure 4A:
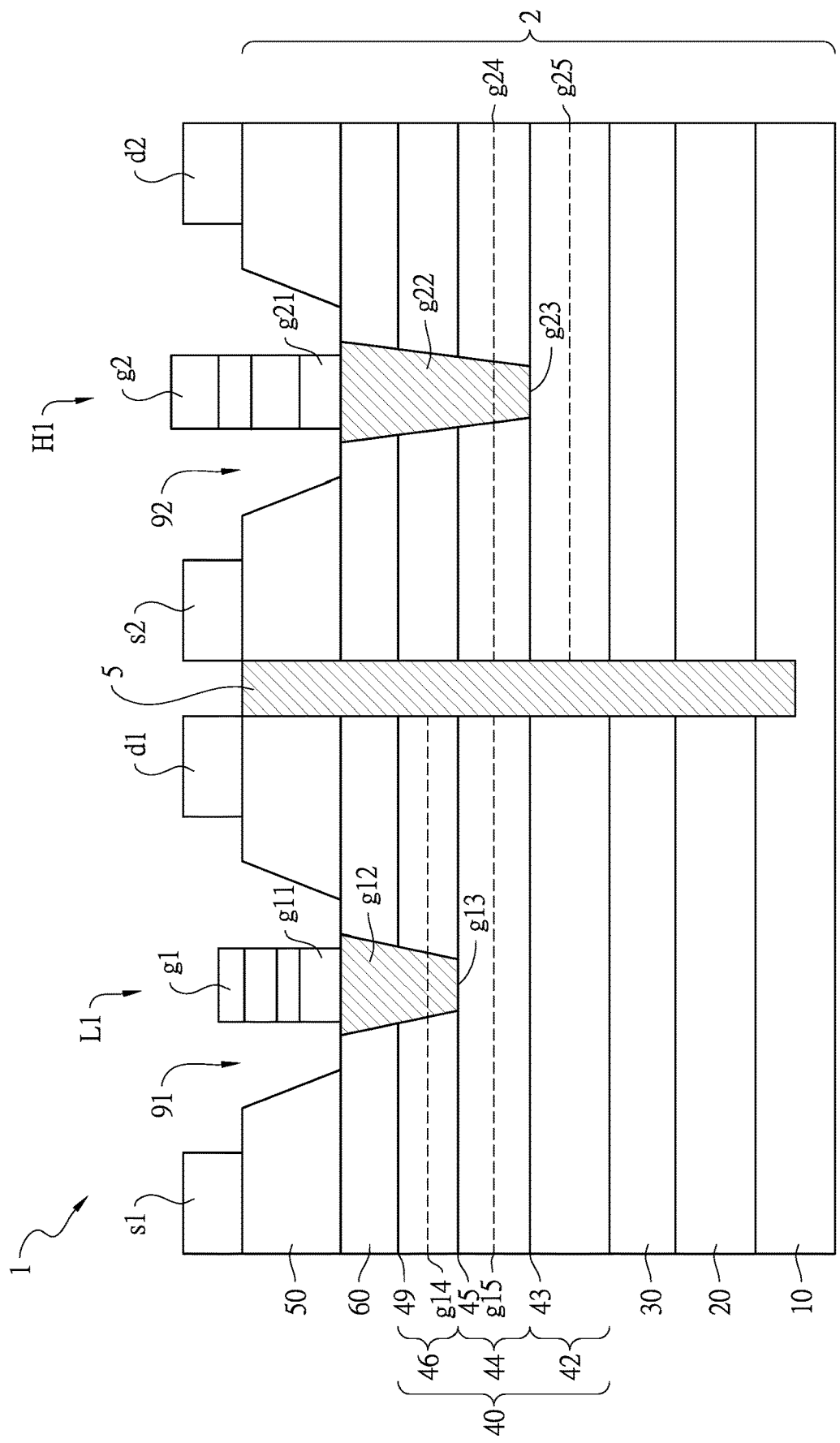
FIGS. 4A-4C are cross-sectional side views of embodiments of a monolithic integrated circuit device having gate-sinking pHEMTs according to the present invention.
Figure 4B:
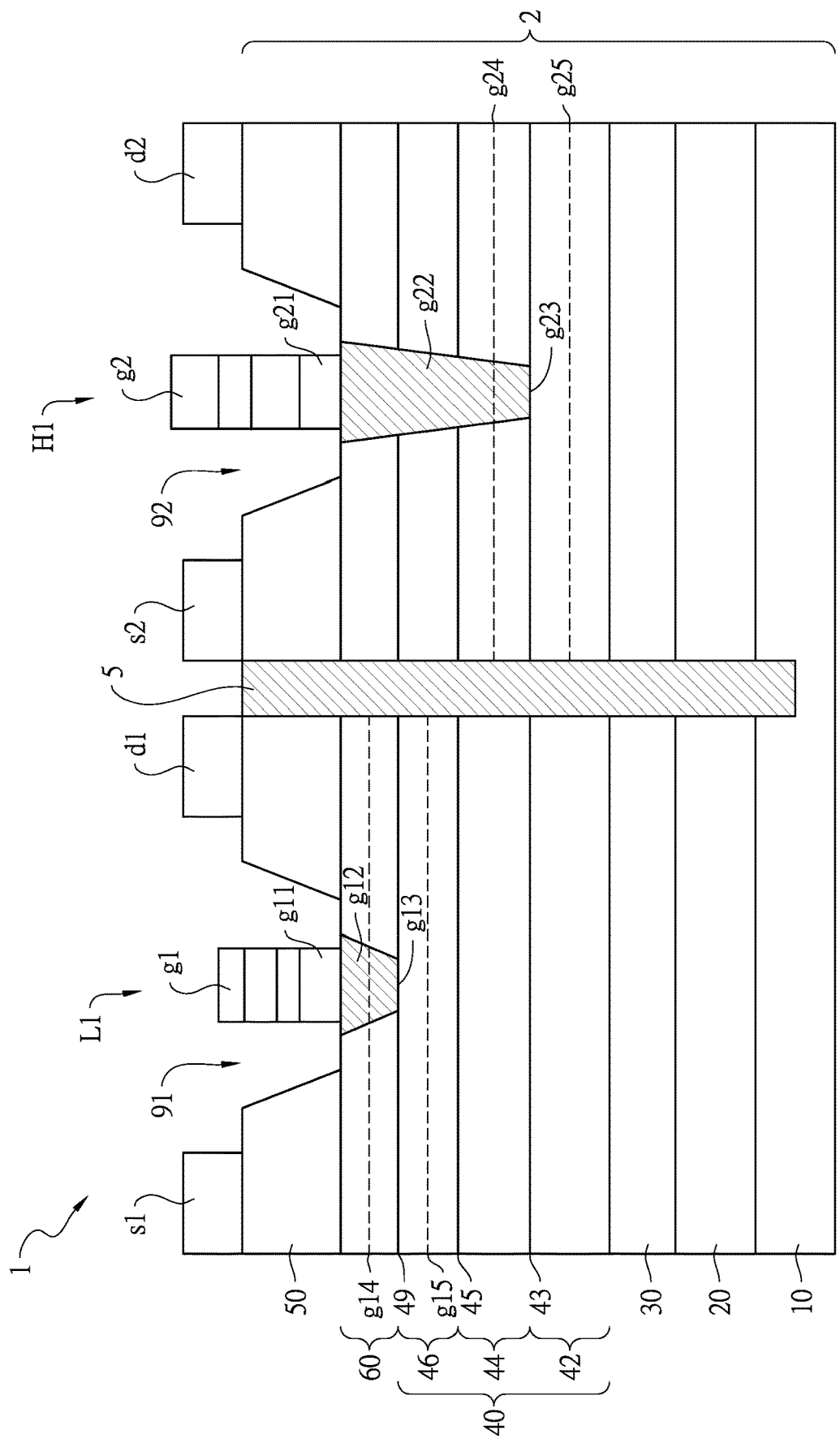
Figure 4C:
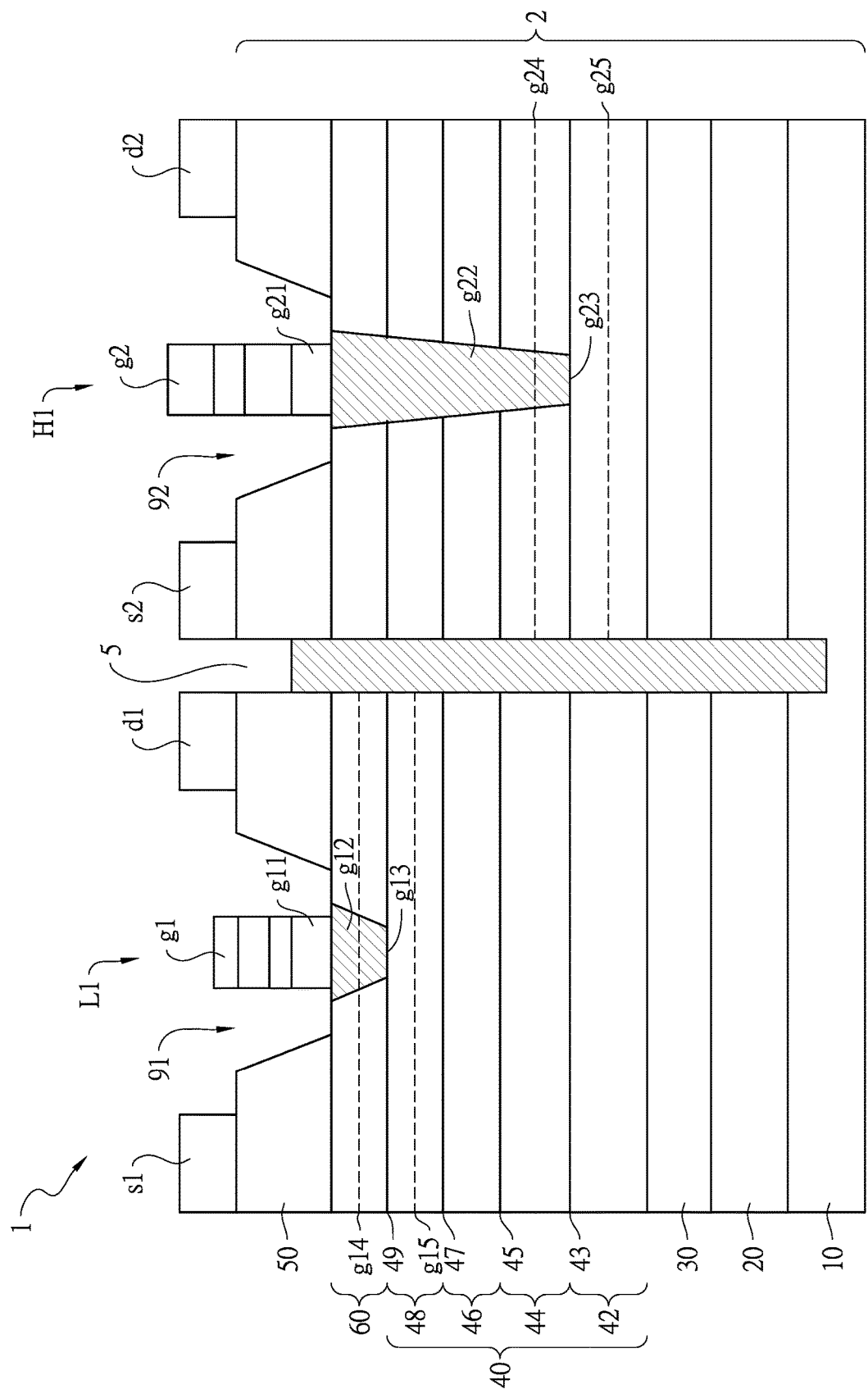

FIGS. 4A-4C show other embodiments of the monolithic integrated circuit device having gate-sinking pHEMTs of the present invention. In FIGS. 4A and 4B, the Schottky layer 40 comprises from bottom to top three stacked regions 42, 44, and 46 of semiconductor material, and the stacked region contact interfaces 43 and 45 are provided between the stacked regions. As described previously, the Schottky layer may comprise more than three stacked regions of semiconductor material. In FIG. 4C, the Schottky layer 40 comprises from bottom to top four stacked regions 42, 44, 46, and 48 of semiconductor material, and the stacked region contact interfaces 43, 45, and 47 are provided between the stacked regions. In FIGS. 4A-4C, the plurality of epitaxial semiconductor layers 2 further comprise a first contact layer 60 which is in contact with an upper surface of the topmost stacked region of the Schottky layer 46. An uppermost contact interface 49 is provided between the first contact layer 60 and the topmost stacked region of the Schottky layer 40. The first cap layer 50 is formed on the first contact layer 60. The respective first gate metal layers g11 and g21 of the low-pinch-off-voltage pHEMT L1 and the high-pinch-off-voltage pHEMT H1 are in contact with the first contact layer 60. The gate-sinking bottom boundary g13 of the low-pinch-off-voltage pHEMT L1 is located between an upper limit g14 and a lower limit g15. The upper limit g14 is 10 Å above the uppermost contact interface 49 or 10 Å above one of the stacked region contact interfaces of the Schottky layer 40. The lower limit g15 is 10 Å below the same contact interface. The gate-sinking bottom boundary g23 of the high-pinch-off-voltage pHEMT H1 is located between an upper limit g24 and a lower limit g25. The upper limit g24 is 10 Å above one of the stacked region contact interfaces of the Schottky layer 40. The lower limit g25 is 10 Å below the same stacked region contact interface. As shown in FIG. 4A, the gate-sinking bottom boundary g13 of the low-pinch-off-voltage pHEMT L1 is located at the stacked region contact interface 45 of the Schottky layer 40, and the gate-sinking bottom boundary g23 of the high-pinch-off-voltage pHEMT H1 is located at the stacked region contact interface 43 of the Schottky layer 40. In FIG. 4B, the gate-sinking bottom boundary g13 of the low-pinch-off-voltage pHEMT L1 is located at the uppermost contact interface 49, and the gate-sinking bottom boundary g23 of the high-pinch-off-voltage pHEMT H1 is located at the stacked region contact interface 43 of the Schottky layer 40. In FIG. 4C, the gate-sinking bottom boundary g13 of the low-pinch-off-voltage pHEMT L1 is located at the uppermost contact interface 49, and the gate-sinking bottom boundary g23 of the high-pinch-off-voltage pHEMT H1 is located at the stacked region contact interface 43 of the Schottky layer 40.

In some embodiments, the first contact layer 60 includes at least one of GaAs, AlGaAs, AlGaAsP, InAlGaAs, InGaP, InGaPAs, and AlInGaP, wherein the first contact layer 60 differs in material from the topmost stacked region of the Schottky layer 40.

In some embodiments, the respective first gate metal layers of the low-pinch-off-voltage pHEMT and the high-pinch-off-voltage pHEMT include at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), and rhenium (Re). In some embodiments, the respective first gate metal layers of the low-pinch-off-voltage pHEMT and the high-pinch-off-voltage pHEMT are made of different materials. In some embodiments, the respective first gate metal layers of the low-pinch-off-voltage pHEMT and the high-pinch-off-voltage pHEMT are made of the same material. In some embodiments, the first gate metal layer of the high-pinch-off-voltage pHEMT is greater in thickness than the first gate metal layer of the low-pinch-off-voltage pHEMT.

Figure 5:
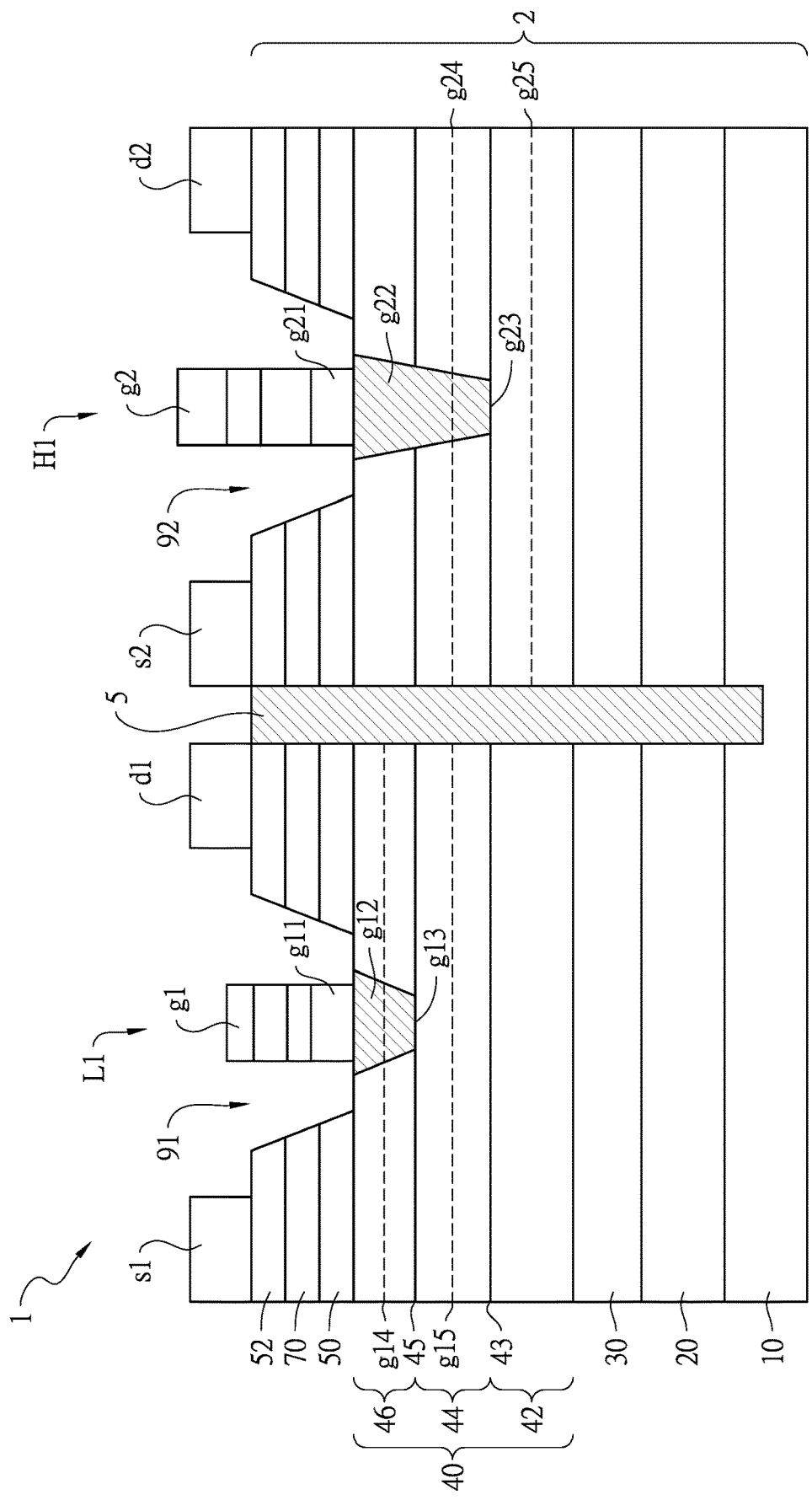
FIGS. 5-7 are cross-sectional side views of embodiments of a monolithic integrated circuit device having gate-sinking pHEMTs according to the present invention.

FIG. 5 shows another embodiment of the monolithic integrated circuit device having gate-sinking pHEMTs of the present invention. In the present embodiment, the plurality of epitaxial semiconductor layers 2 further comprise an etch stop layer 70 and a second cap layer 52. The etch stop layer 70 is coupled to the first cap layer 50. The second cap layer 52 is formed on the etch stop layer 70. The respective source and drain contacts s1, s2, d1, and d2 of the low-pinch-off-voltage pHEMT L1 and the high-pinch-off-voltage pHEMT H1 are coupled to the second cap layer.

In some embodiments, the etch stop layer 70 includes at least one of InGaP, InGaPAs, AlInGaP, and AlAs, and the second cap layer 52 is GaAs. In some embodiments, the first cap layer 50 is GaAs. In some embodiments, the channel layer 30 includes at least one of GaAs and InGaAs. In some embodiments, the buffer layer 20 includes at least one of GaAs and AlGaAs. In some embodiments, the compound semiconductor substrate 10 is GaAs.

Figure 6:
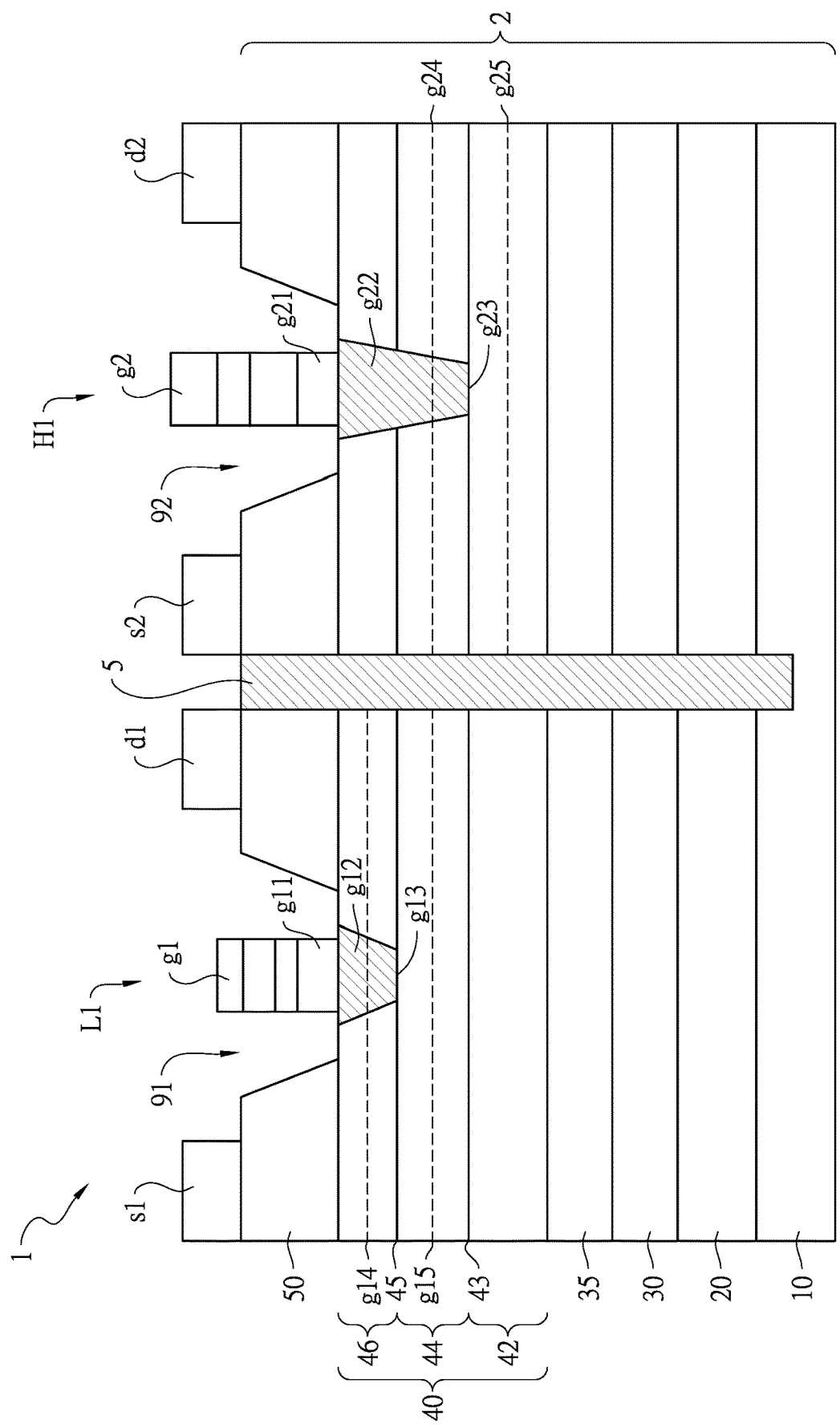

FIG. 6 shows another embodiment of the monolithic integrated circuit device having gate-sinking pHEMTs provided by the present invention. In the present embodiment, the plurality of epitaxial semiconductor layers further comprise a carrier supply layer 35. The carrier supply layer is formed on the channel layer 30, and the Schottky layer 40 is formed on the carrier supply layer 35. In some embodiments, the carrier supply layer 35 includes at least one of AlGaAs, AlGaAsP, and InAlGaAs.

Figure 7:
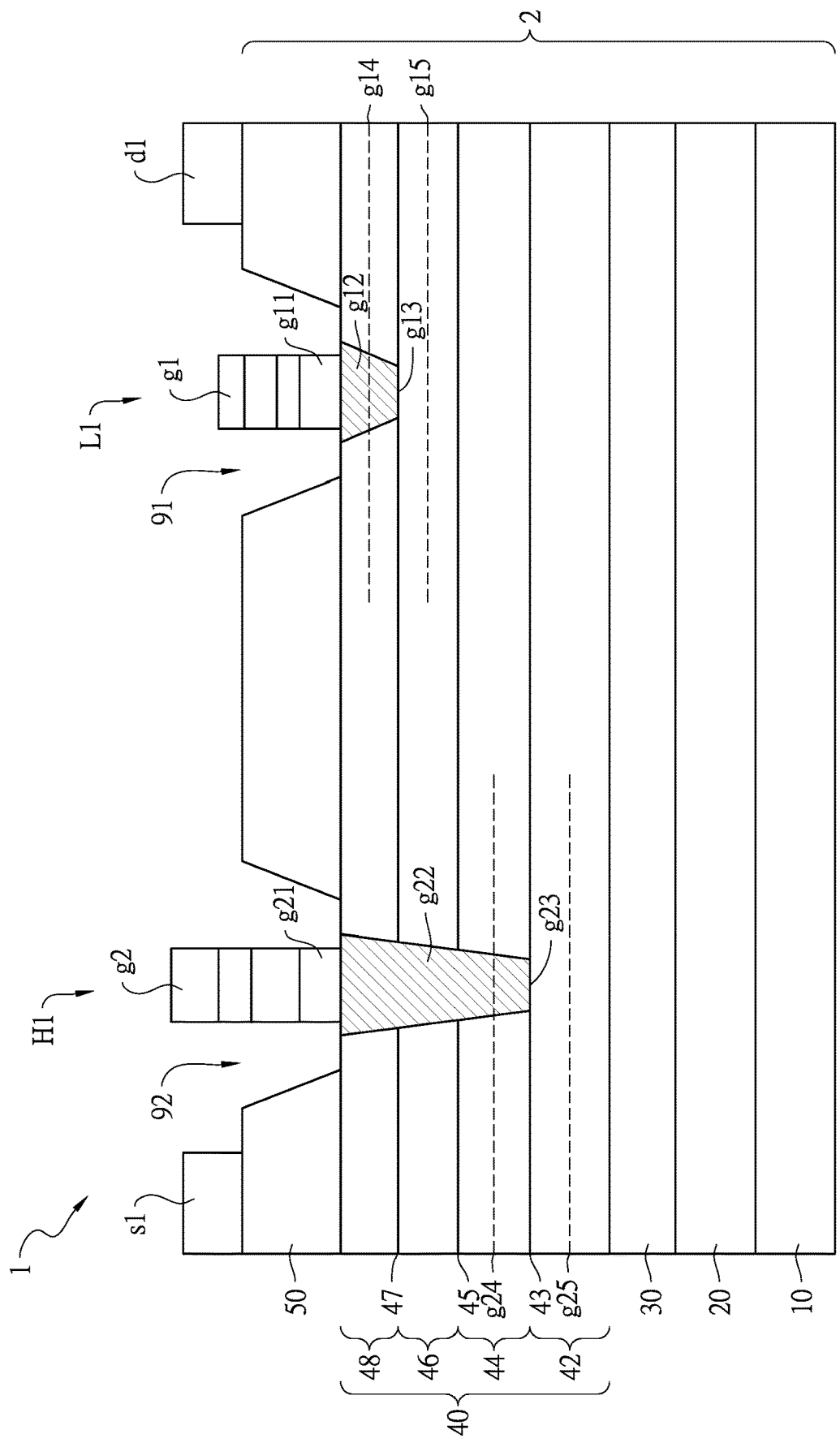

FIG. 7 shows another embodiment of the monolithic integrated circuit device having gate-sinking pHEMTs provided by the present invention. In the present embodiment, the Schottky layer 40 comprises from bottom to top four stacked regions 42, 44, 46, and 48 of semiconductor material, and the stacked region contact interfaces 43, 45, and 47 are provided between the stacked regions. The low-pinch-off-voltage pHEMT L1 and the high-pinch-off-voltage pHEMT H1 share a pair of source s1 and drain d1 contacts. The low-pinch-off-voltage pHEMT includes a gate contact g1. The gate contact g1 comprises a first gate metal layer g11, a gate-sinking region g12, and a gate-sinking bottom boundary g13. The high-pinch-off-voltage pHEMT H1 includes a gate contact g2. The gate contact g2 comprises a first gate metal layer g21, a gate-sinking region g22, and a gate-sinking bottom boundary g23. The respective gate recesses 91 and 92 of the low-pinch-off-voltage pHEMT L1 and the high-pinch-off-voltage pHEMT H1 are located between the source contact s1 and the drain contact d1. The gate contact g1 of the low-pinch-off-voltage pHEMT L1 which is coupled to the Schottky layer 40 locates within the gate recess 91. The gate contact g2 of the high-pinch-off-voltage pHEMT H1 which is coupled to the Schottky layer 40 locates within the gate recess 92. The respective first gate metal layers g11 and g21 of the low-pinch-off-voltage pHEMT L1 and the high-pinch-off-voltage pHEMT H1 are in contact with the topmost stacked region 46 of the Schottky layer 40. The low-pinch-off-voltage pHEMT gate-sinking region g12 is beneath the low-pinch-off-voltage pHEMT first gate metal layer g11. The high-pinch-off-voltage pHEMT gate-sinking region g22 is beneath the high-pinch-off-voltage pHEMT first gate metal layer g21. In FIG. 7, the upper limit g14 and the lower limit g15 are 10 Å above and 10 Å below the stacked region contact interface 47, respectively. The upper limit g24 and the lower limit g25 are 10 Å above and 10 Å below the stacked region contact interface 43, respectively. The gate-sinking bottom boundary g13 of the low-pinch-off-voltage pHEMT L1 is located at the stacked region contact interface 47 of the Schottky layer 40. The gate-sinking bottom boundary g23 of the high-pinch-off-voltage pHEMT H1 is located at the stacked region contact interface 43 of the Schottky layer 40.

Accordingly, the uniformity of the pinch-off voltage and the gate-to-channel distance of each pHEMT in the monolithic integrated circuit device are markedly improved. Moreover, the pinch-off voltage of each pHEMT in the monolithic integrated circuit device can be designed to any (positive or negative) desired value. Also, the fabrication process is simplified, and the economic benefit is improved.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A monolithic integrated circuit device having gate-sinking pHEMTs, comprising:
   a low-pinch-off-voltage pHEMT and a high-pinch-off-voltage pHEMT in a multi-layer structure,
   wherein the multi-layer structure includes a semiconductor substrate overlaid with a plurality of epitaxial semiconductor layers common to the low-pinch-off-voltage and the high-pinch-off-voltage pHEMTs, including a buffer layer overlaid by a channel layer overlaid by a Schottky layer overlaid by a first cap layer,
   wherein the Schottky layer comprises from bottom to top at least three stacked regions of semiconductor material, wherein each of the two adjacent stacked regions differs in material and provides a stacked region contact interface therebetween, wherein any two stacked region contact interfaces differ in distance from the semiconductor substrate,
   wherein source and drain contacts of the low-pinch-off-voltage and the high-pinch-off-voltage pHEMTs are coupled to the first cap layer,
   wherein the low-pinch-off-voltage and the high-pinch-off-voltage pHEMTs each include a gate contact, a first gate metal layer, a gate-sinking region, and a gate-sinking bottom boundary,
   wherein the respective gate contacts of the low-pinch-off-voltage pHEMT and the high-pinch-off-voltage pHEMT are coupled to the Schottky layer, wherein the respective first gate metal layers of the low-pinch-off-voltage pHEMT and the high-pinch-off-voltage pHEMT are in contact with the topmost stacked region of the Schottky layer,
   wherein the low-pinch-off-voltage pHEMT gate-sinking region and the high-pinch-off-voltage pHEMT gate-sinking region are beneath the first gate metal layers of the low-pinch-off-voltage pHEMT and the high-pinch-off-voltage pHEMT, respectively,
   wherein the respective gate-sinking bottom boundaries of the low-pinch-off-voltage pHEMT and the high-pinch-off-voltage pHEMT are located within the Schottky layer, wherein the gate-sinking bottom boundary of the high-pinch-off-voltage pHEMT is closer to the semiconductor substrate than the gate-sinking bottom boundary of the low-pinch-off-voltage pHEMT, and the gate-sinking bottom boundary of the high-pinch-off-voltage pHEMT is located within 10 Å above or below one of the stacked region contact interfaces of the Schottky layer.

2. The monolithic integrated circuit device having gate-sinking pHEMTs of claim 1, wherein the gate-sinking bottom boundary of the low-pinch-off-voltage pHEMT is located within 10 Å above or below one of the stacked region contact interfaces of the Schottky layer.

3. The monolithic integrated circuit device having gate-sinking pHEMTs of claim 1, wherein the gate-sinking bottom boundary of the high-pinch-off-voltage pHEMT is located at one of the stacked region contact interfaces of the Schottky layer.

4. The monolithic integrated circuit device having gate-sinking pHEMTs of claim 1, wherein the gate-sinking bottom boundary of the low-pinch-off-voltage pHEMT is located at one of the stacked region contact interfaces of the Schottky layer.

5. The monolithic integrated circuit device having gate-sinking pHEMTs of claim 1, wherein in any two adjacent stacked regions of the Schottky layer, one stacked region composed of AlGaAs-based semiconductor material alternates with the other stacked region composed of InGaP-based semiconductor material, wherein the AlGaAs-based semiconductor material includes at least one of AlGaAs, AlGaAsP, and InAlGaAs, and wherein the InGaP-based semiconductor material includes at least one of InGaP, InGaPAs, and AlInGaP.

6. The monolithic integrated circuit device having gate-sinking pHEMTs of claim 1, wherein the plurality of epitaxial semiconductor layers further comprise a first contact layer, wherein the first contact layer is in contact with an upper surface of the topmost stacked region of the Schottky layer, wherein an uppermost contact interface is provided between the first contact layer and the topmost stacked region of the Schottky layer, wherein the first cap layer is formed on the first contact layer, wherein the first contact layer includes at least one of GaAs, AlGaAs, AlGaAsP, InAlGaAs, InGaP, InGaPAs, and AlInGaP, wherein the first contact layer differs in material from the topmost stacked region of the Schottky layer.

7. The monolithic integrated circuit device having gate-sinking pHEMTs of claim 6, wherein the respective first gate metal layers of the low-pinch-off-voltage pHEMT and the high-pinch-off-voltage pHEMT are in contact with the first contact layer.

8. The monolithic integrated circuit device having gate-sinking pHEMTs of claim 1, wherein the respective first gate metal layers of the low-pinch-off-voltage pHEMT and the high-pinch-off-voltage pHEMT include at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), and rhenium (Re).

9. The monolithic integrated circuit device having gate-sinking pHEMTs of claim 8, wherein the respective first gate metal layers of the low-pinch-off-voltage pHEMT and the high-pinch-off-voltage pHEMT are made of different materials.

10. The monolithic integrated circuit device having gate-sinking pHEMTs of claim 8, wherein the respective first gate metal layers of the low-pinch-off-voltage pHEMT and the high-pinch-off-voltage pHEMT are made of the same material.

11. The monolithic integrated circuit device having gate-sinking pHEMTs of claim 10, wherein the first gate metal layer of the high-pinch-off-voltage pHEMT is greater in thickness than the first gate metal layer of the low-pinch-off-voltage pHEMT.

12. The monolithic integrated circuit device having gate-sinking pHEMTs of claim 1, wherein the plurality of epitaxial semiconductor layers further comprise an etch stop layer and a second cap layer, wherein the etch stop layer is coupled to the first cap layer, wherein the second cap layer is formed on the etch stop layer, wherein the respective source and drain contacts of the low-pinch-off-voltage pHEMT and the high-pinch-off-voltage pHEMT are coupled to the second cap layer.

13. The monolithic integrated circuit device having gate-sinking pHEMTs of claim 12, wherein the etch stop layer includes at least one of InGaP, InGaPAs, AlInGaP, and AlAs, wherein the second cap layer is GaAs.

14. The monolithic integrated circuit device having gate-sinking pHEMTs of claim 1, wherein the first cap layer is GaAs, wherein the channel layer includes at least one of GaAs and InGaAs, wherein the buffer layer includes at least one of GaAs and AlGaAs, wherein the compound semiconductor substrate is GaAs.

15. The monolithic integrated circuit device having gate-sinking pHEMTs of claim 1, wherein the plurality of epitaxial semiconductor layers further comprise a carrier supply layer, wherein the carrier supply layer is formed on the channel layer, wherein the Schottky layer is formed on the carrier supply layer, wherein the carrier supply layer includes at least one of AlGaAs, AlGaAsP, and InAlGaAs.

16. A monolithic integrated circuit device having gate-sinking pHEMTs, comprising:
a low-pinch-off-voltage pHEMT and a high-pinch-off-voltage pHEMT in a multi-layer structure,
wherein the multi-layer structure includes a semiconductor substrate overlaid with a plurality of epitaxial semiconductor layers common to the low-pinch-off-voltage and the high-pinch-off-voltage pHEMTs, including a buffer layer overlaid by a channel layer overlaid by a Schottky layer overlaid by a first contact layer overlaid by a first cap layer,
wherein the Schottky layer comprises from bottom to top at least three stacked regions of semiconductor material, wherein each of the two adjacent stacked regions differs in material and provides a stacked region contact interface therebetween, wherein any two stacked region contact interfaces differ in distance from the semiconductor substrate,
wherein the first contact layer is in contact with an upper surface of the topmost stacked region of the Schottky layer, and an uppermost contact interface is provided between the first contact layer and the topmost stacked region of the Schottky layer,
wherein source and drain contacts of the low-pinch-off-voltage and the high-pinch-off-voltage pHEMTs are coupled to the first cap layer,
wherein the low-pinch-off-voltage and the high-pinch-off-voltage pHEMTs each include a gate contact, a first gate metal layer, a gate-sinking region, and a gate-sinking bottom boundary,
wherein the respective gate contacts of the low-pinch-off-voltage pHEMT and the high-pinch-off-voltage pHEMT are coupled to the Schottky layer, wherein the respective first gate metal layers of the low-pinch-off-voltage pHEMT and the high-pinch-off-voltage pHEMT are in contact with the first contact layer,
wherein the low-pinch-off-voltage pHEMT gate-sinking region and the high-pinch-off-voltage pHEMT gate-sinking region are beneath the first gate metal layers of the low-pinch-off-voltage pHEMT and the high-pinch-off-voltage pHEMT, respectively,
wherein the gate-sinking bottom boundary of the low-pinch-off-voltage pHEMT is located within 10 Å above or below the uppermost contact interface, and wherein the gate-sinking bottom boundary of the high-pinch-off-voltage pHEMT is located within 10 Å above or below one of the stacked region contact interfaces of the Schottky layer.

17. The monolithic integrated circuit device having gate-sinking pHEMTs of claim 16, wherein the gate-sinking bottom boundary of the low-pinch-off-voltage pHEMT is located at the uppermost contact interface.

18. The monolithic integrated circuit device having gate-sinking pHEMTs of claim 16, wherein in any two adjacent stacked regions of the Schottky layer, one stacked region composed of AlGaAs-based semiconductor material alternates with the other stacked region composed of InGaP-based semiconductor material, wherein the AlGaAs-based semiconductor material includes at least one of AlGaAs, AlGaAsP, and InAlGaAs, and the InGaP-based semiconductor material includes at least one of InGaP, InGaPAs, and AlInGaP.

19. The monolithic integrated circuit device having gate-sinking pHEMTs of claim 18, wherein the first contact layer includes at least one of GaAs, AlGaAs, AlGaAsP, InAlGaAs, InGaP, InGaAsP, and InAlGaP, and the first contact layer differs in material from the topmost stacked region of the Schottky layer.

* * * * *